United States Patent
Funaki (10) Patent No.: US 7,960,834 B2
(45) Date of Patent: Jun. 14, 2011

(54) ELECTRONIC ELEMENT THAT INCLUDES MULTILAYERED BONDING INTERFACE BETWEEN FIRST ELECTRODE HAVING ALUMINUM-CONTAINING SURFACE AND SECOND ELECTRODE COMPOSED OF METAL NANOPARTICLE SINTERED BODY

(75) Inventor: Tatsuya Funaki, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 258 days.

(21) Appl. No.: 12/256,834

(22) Filed: Oct. 23, 2008

(65) Prior Publication Data

US 2009/0039507 A1 Feb. 12, 2009

Related U.S. Application Data

(63) Continuation of application No. PCT/JP2007/055290, filed on Mar. 15, 2007.

(30) Foreign Application Priority Data

Apr. 24, 2006 (JP) .................. 2006-119200

(51) Int. Cl.
*H01L 23/492* (2006.01)
(52) U.S. Cl. . 257/762; 257/765; 257/781; 257/E23.026; 977/779
(58) Field of Classification Search .............. 257/746; 977/779
See application file for complete search history.

(56) References Cited

U.S. PATENT DOCUMENTS

| 3,837,000 | A | * | 9/1974 | Platzoeder et al. | ........... 257/762 |
| 5,854,514 | A | * | 12/1998 | Roldan et al. | ................ 257/746 |
| 7,393,771 | B2 | * | 7/2008 | Hozoji et al. | ................ 438/610 |

FOREIGN PATENT DOCUMENTS

| JP | 2-191332 | 7/1990 |
| JP | 09-326416 | 12/1997 |
| JP | 10-294018 | 11/1998 |
| JP | 2002-299833 | 10/2002 |
| JP | 2003-174055 | 6/2003 |
| JP | 2004-128357 | 4/2004 |
| JP | 2005-303079 | 10/2005 |

OTHER PUBLICATIONS

PCT/JP2007/055290 International Search Report dated Jun. 12, 2007.
PCT/JP2007/055290 Written Opinion dated Jun. 12, 2007.

* cited by examiner

*Primary Examiner* — Stephen W Smoot
(74) *Attorney, Agent, or Firm* — Dickstein Shapiro LLP (57) ABSTRACT

An electronic element including an electronic element base and electrodes each of which has a first electrode having a surface composed of at least Al or an Al alloy and a second electrode composed of a metal nanoparticle sintered body and bonded to the first electrode. A bonding interface between the first electrode and the second electrode has a multilayer structure including, from the side of the first electrode to the side of the second electrode, (a) a first layer primarily composed of Al, (b) a second layer primarily composed of an Al oxide, (c) a third layer primarily composed of an alloy of Al and a constituent element of metal nanoparticles, and (d) a fourth layer primarily composed of the constituent element of the metal nanoparticles.

4 Claims, 6 Drawing Sheets

ELECTRONIC ELEMENT THAT INCLUDES MULTILAYERED BONDING INTERFACE BETWEEN FIRST ELECTRODE HAVING ALUMINUM-CONTAINING SURFACE AND SECOND ELECTRODE COMPOSED OF METAL NANOPARTICLE SINTERED BODY

CROSS REFERENCE TO RELATED APPLICATIONS

The present application is a continuation of International Application No. PCT/JP2007/055290, filed Mar. 15, 2007, which claims priority to Japanese Patent Application No. JP2006-119200, filed Apr. 24, 2006, the entire contents of each of these applications being incorporated herein by reference in their entirety.

FIELD OF THE INVENTION

The present invention relates to an electronic element including electrodes each having a surface composed of at least Al or an Al alloy, an electronic element device using the same, and a manufacturing method thereof.

BACKGROUND OF THE INVENTION

In recent years, concomitant with reduction in size of electronic apparatuses, higher integration of semiconductor packages has been increasingly required. Even in a mounting technique in which a semiconductor package is mounted on and fixed to a substrate so as to obtain electrical conduction, higher integration and higher density have been required.

Accordingly, a bonding method by a so-called BGA (Ball Grid Array) in which solder balls each used as an electrode are arranged in a lattice over an entire rear surface of a semiconductor package has drawn attention and has been practically used. In this BGA type semiconductor package, since electrodes are disposed on the entire rear surface as described above, the number of electrodes per unit area of the semiconductor package can be increased, and as a result, a significant effect of realizing high density mounting and reduction in mounting area can be obtained.

However, when the BGA method is used, as the pitches between solder balls are decreased, a so-called bridge is generated during re-flow, and as a result, short-circuiting between electrodes is liable to occur. This short-circuiting may be said as an inevitable phenomenon of micro soldering in which after a solder alloy is once melted and liquidized by heating, the alloy is solidified by cooling for bonding.

In addition, when one electronic component device is formed by bonding a plurality of necessary electronic elements together, so-called step soldering is performed in which solder materials having sequentially lower melting points are consecutively used as bonding of an electronic element is consecutively performed; however, when this step soldering is performed, solder bonding at a first step must be performed using a high temperature solder. As a practical material for the high temperature solder as described above, Pb-5Sn based solder may be mentioned by way of example; however, regulations against the use of Pb have become stricter concomitant with recent requirements for environmental conservation, and development of an alternative material has been strongly requested.

In order to solve the problems described above, an electrode-provided base substance and an electrode-bonding method thereof have been proposed. The electrode-provided base substance is a base substance including many electrodes, and these electrodes are to be bonded to electrodes of another base substance by a bonding material including composite-type metal nanoparticles as a primary material which are formed by boding and covering peripheries of metal nuclei having an average particle diameter of approximately 100 nm using an organic material (see Patent Documents 1 and 2).

Figure 12:
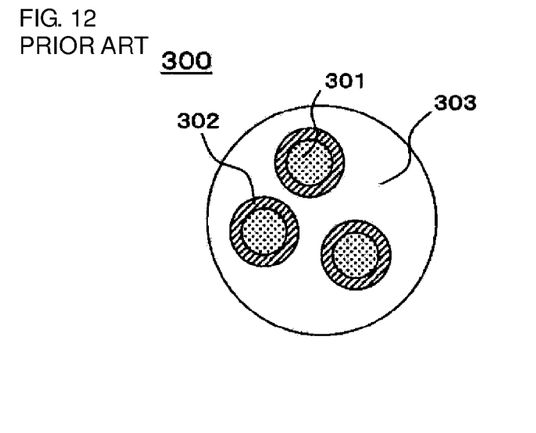
FIG. 12 is a schematic view showing the structure of the metal nanoparticle paste.

The composition of a metal nanoparticle paste used as the bonding material described above is schematically shown in FIG. 12. A metal nanoparticle paste 300 is formed such that after surfaces of metal nanoparticles 301 composed, for example, of Au, Ag, or Cu having an average particle diameter of 1 to 100 nm are covered with a dispersing agent 302 (such as an amine, an alcohol, or a thiol-based material) which can coordinate with a metal element included in the metal fine particles, the metal nanoparticles 301 are stably dispersed in an organic solvent 303 (toluene, xylene, terpineol, mineral spirit, decanol, tetradecan, or the like) which is a dispersion medium. In addition, additives, such as a binder component and a reducing agent, may also be used (see Patent Document 3).

When a metal nanoparticle paste composed of a non-Pb material as described above is used, a bonding portion may be formed by firing metal fine particles at a low temperature unlike the case of a conventional solder material in which bonding is performed by solidification following melting; hence, environmental burden can be reduced, and in addition, an electronic element device having high bonding reliability can be obtained.

Figure 13:
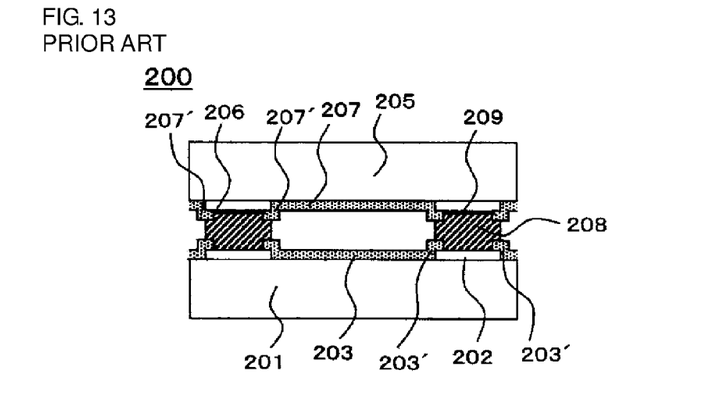
FIG. 13 is a cross-sectional view showing one example of a conventional electronic element device.
Figure 14A:
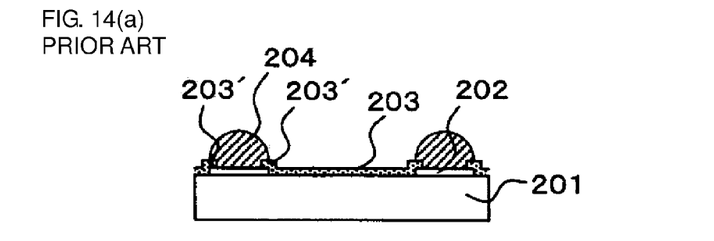
FIGS. 14(a) to 14(c) are schematic views showing a process for manufacturing the conventional electronic element device.
Figure 14B:
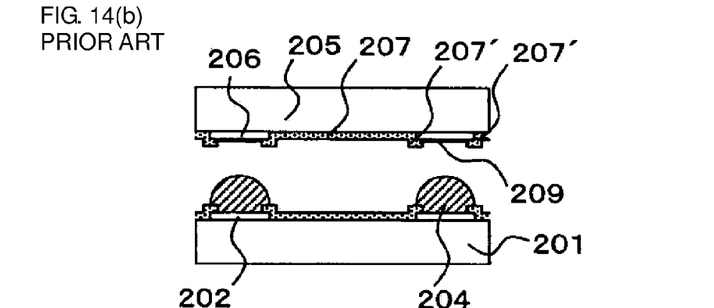
Figure 14C:
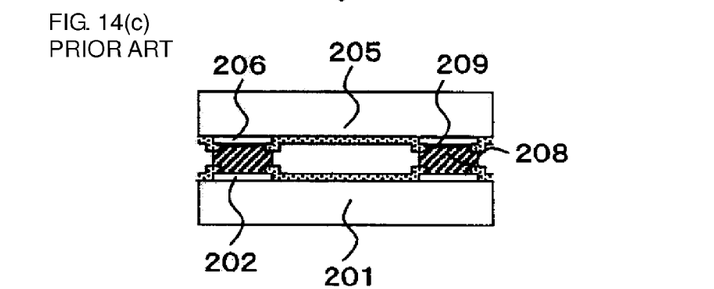

As examples of the electrode-provided base substance and the electrode-bonding method thereof disclosed in the Patent Documents 1 and 2, FIG. 13 shows a cross-sectional view of one example of an electronic element device obtained by flip-chip connection using the metal nanoparticle paste disclosed in the Patent Document 3, and FIG. 14 shows one example of the manufacturing method thereof.

The manufacturing process will be described with reference to FIGS. 14(a) to 14(c). First, as shown in FIG. 14(a), after a substrate 201 on which substrate electrodes 202 provided to obtain electrical conduction to an electronic element 205, a resist film 203, and dam portions 203' are formed at an upper surface side is prepared, a metal nanoparticle paste 204 is applied onto the substrate electrodes 202.

Next, as shown in FIG. 14(b), after the electronic element 205 on which electronic element electrodes 206 provided to obtain electrical conduction to the substrate 201, a passivation film 207, and dam portions 207' are formed at an upper surface side is prepared, the electronic element 205 is placed upside down, and the substrate 201 and the electronic element 205 are aligned so that the substrate electrodes 202 face the respective electronic element electrodes 206.

Subsequently, as shown in FIG. 14(c), after the substrate 201 and the electronic element 205 are overlapped with each other, the metal nanoparticle paste 204 is sintered by heating to form metal nanoparticle paste sintered bodies 208 for bonding the substrate 201 and the electronic element 205, so that an electronic element device 200 as shown in FIG. 13 is obtained.

In addition, a technique has also been proposed in which after plating is performed on surfaces of electrodes provided on a substrate in order to improve bonding properties to metal particles, porous metal bumps used for fine pattern connection are formed by sintering the metal fine particles (see Patent Document 4).

Patent Document 1: Japanese Unexamined Patent Application Publication No. 9-326416

Patent Document 2: Japanese Unexamined Patent Application Publication No. 2004-128357

Patent Document 3: Japanese Unexamined Patent Application Publication No. 2002-299833

Patent Document 4: Japanese Unexamined Patent Application Publication No. 2003-174055

As the electronic element electrode 206 on the electronic element 205 shown in FIGS. 13 and 14 which illustrate the example of the electrode-provided base substance and the electrode-bonding method thereof disclosed in the Patent Documents 1 and 2, in consideration of electrical conductivity and workability (dimensional accuracy, working speed, and the like), in general, Al or an Al alloy has been used in many cases. However, the surface of the Al electrode is generally covered with an Al oxide film 209 as shown in FIG. 14(b).

Figure 15:
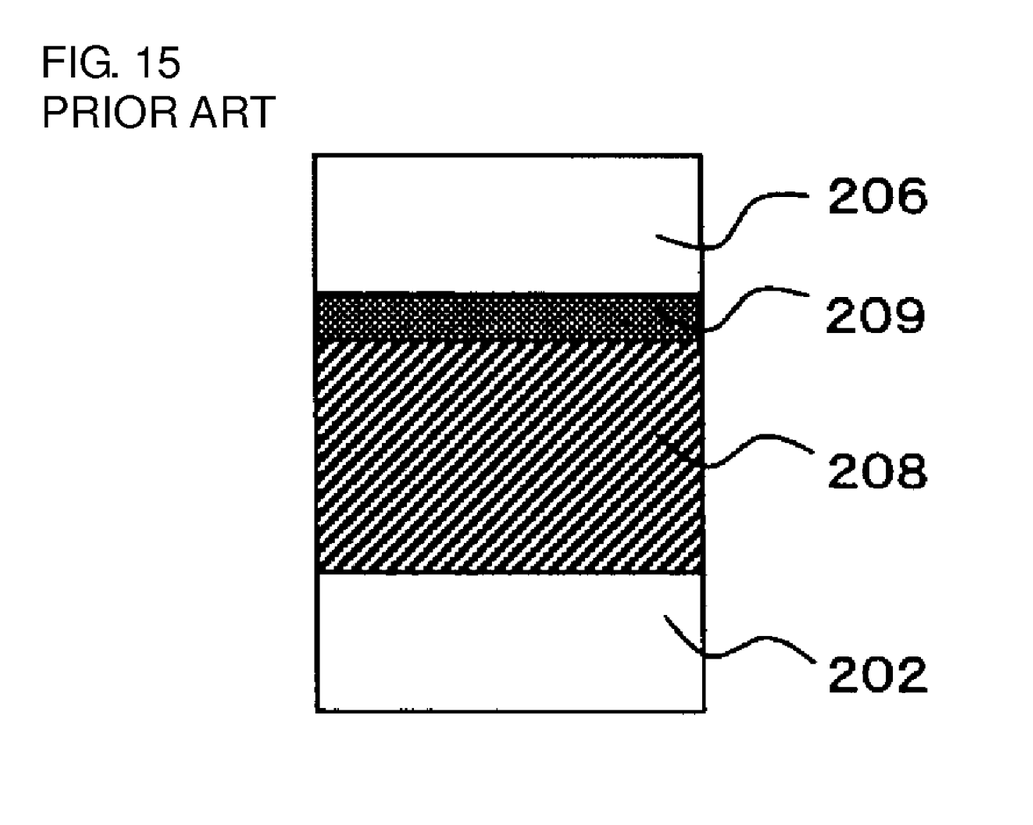
FIG. 15 is a cross-sectional view showing a detailed area structure between an electronic element electrode and a substrate electrode at the stage shown in FIG. 14(c).

Hence, when the bonding as described above is performed without performing any pre-treatment, as shown in FIG. 14(c) and FIG. 15 which is an enlarged view thereof, the Al oxide film 209 is actually present between the substrate electrode 202 and the electronic element electrode 206. In the case as described above, the metal nanoparticle sintered body 208 and the Al oxide film 209 are not sufficiently bonded to each other, and as a result, a problem in that the bonding reliability and the electrical conductivity are degraded may arise.

In addition, according to the method disclosed in the Patent Document 4, when Al is used as a material for the electrodes provided on the substrate, since the Al electrode is also placed in the state in which the surface thereof is generally covered with an Al oxide film as described above, first, a step of removing the Al oxide film is additionally required, and plating must be performed thereafter. Hence, the process becomes complicated, and as a result, a problem in that manufacturing cost of the electronic element device is increased may arise.

SUMMARY OF THE INVENTION

Accordingly, an object of the present invention is to provide an electronic element which has high bonding reliability and electrical conductivity although it is formed by a simple manufacturing process and at a low manufacturing cost and which includes connection portions in each of which an electrode having a surface composed of at least Al or an Al alloy and a sintered body formed of metal nanoparticles are connected to each other; an electronic element device using the electronic element; and a manufacturing method thereof.

In order to solve the technical problems described above, in an electronic element comprising: an electronic element base; and an electrode which includes a first electrode having a surface composed of at least Al or an Al alloy and a second electrode composed of a metal nanoparticle sintered body and bonded to the first electrode, a bonding interface between the first electrode and the second electrode has a multilayer structure including, from the side of the first electrode to the side of the second electrode;

(a) a first layer primarily composed of Al, (b) a second layer primarily composed of an Al oxide, (c) a third layer primarily composed of an alloy of Al and a constituent element of metal nanoparticles, and (d) a fourth layer primarily composed of the constituent element of the metal nanoparticles.

In addition, the metal nanoparticles may include Ag or a Ag alloy.

In addition, in an electronic element device in which an electrode of a first electronic element and an electrode of a second electronic element are electrically connected to each other with a bonding portion interposed therebetween, at least one of the first electronic element and the second electronic element is the electronic element according to the present invention, the electrode of the at least one electronic element electrically connected through the bonding portion includes the first electrode and the second electrode, and a bonding interface therebetween has the multilayer structure.

In addition, the electrode of the second electronic element may be connected so as to face each other.

In addition, in a method for manufacturing an electronic element including an electronic element base and an electrode which includes a first electrode having a surface composed of at least Al or an Al alloy and a second electrode composed of a metal nanoparticle sintered body and bonded to the first electrode, the method comprises: a first step of forming the first electrode on the electronic element base; a second step of applying a metal nanoparticle paste including metal nanoparticles having an average particle diameter of 1 to 100 nm, a dispersing agent, and an organic solvent onto the first electrode; and a third step of sintering the metal nanoparticles so that the second electrode is bonded onto the first electrode to form the electrode by performing heating at a temperature equal to or higher than that at which the dispersing agent and the organic solvent included in the metal nanoparticle paste are removed and at a temperature lower than the melting point of the metal nanoparticles in the state in which a predetermined space is ensured around the periphery of the metal nanoparticle paste applied onto the first electrode.

In addition, the thickness of the metal nanoparticle paste applied onto the first electrode may be in the range of 0.1 to 20 µm.

In addition, the thickness of the metal nanoparticle paste applied onto the first electrode may be in the range of 0.1 to 15 µm.

In addition, the heating may be performed in an atmosphere containing oxygen at a concentration higher than that in the air.

In addition, in the method for manufacturing an electronic element device according to the present invention in which after a bonding material in the form of a paste is applied between an electrode of a first electronic element and an electrode of a second electronic element, the bonding material is cured so that a bonding portion between the electrode of the first electronic element and the electrode of the second electronic element is formed.

In addition, the bonding portion between the electrode of the first electronic element and the electrode of the second electronic element may be formed in the state in which the electrode of the first electronic element and the electrode of the second electronic element face each other.

In an electronic element according to the present invention comprising: an electronic element base; and an electrode which includes a first electrode having a surface composed of at least Al or an Al alloy and a second electrode composed of a metal nanoparticle sintered body and bonded to the first electrode, a bonding interface between the first electrode and the second electrode has a multilayer structure including, from the side of the first electrode to the side of the second electrode;

(a) a first layer primarily composed of Al, (b) a second layer primarily composed of an Al oxide, (c) a third layer primarily composed of an alloy of Al and a constituent element of metal nanoparticles, and (d) a fourth layer primarily composed of the constituent element of the metal nanoparticles; hence when the electronic element is bonded to substrate electrodes, high bonding reliability and electrical conductivity can be obtained.

That is, between a layer composed of a metal nanoparticle sintered body and a layer primarily composed of an Al oxide film which is liable to cause a bonding problem, an alloy layer is provided which is primarily composed of an alloy of Al and a constituent element of metal nanoparticles and which has superior bonding properties both to the Al oxide film and the metal nanoparticle sintered body; hence, the above two can be tightly bonded to each other.

When the metal nanoparticles are composed of Ag or a Ag alloy, a step of forming a metal nanoparticle sintered body can be performed in the air, and in addition, the electrical conductivity can be increased; hence, it is preferable.

In addition, in an electronic element device according to the present invention in which an electrode of a first electronic element and an electrode of a second electronic element are electrically connected to each other with a bonding portion interposed therebetween, the electrode of the at least one electronic element electrically connected through the bonding portion includes the first electrode and the second electrode, and a bonding interface therebetween has the multilayer structure; hence, high electrical conductivity can be obtained between the first electronic element and the second electronic element.

In addition, when the electrode of the first electronic element and the electrode of the second electronic element are connected so as to face each other, and even when a fine connection portion must be formed in order to realize high density mounting and/or reduction in mounting area by increasing the number of electrodes of the electronic element per unit area, sufficient bonding reliability can be ensured.

In addition, in a method for manufacturing an electronic element according to the present invention in which the electronic element includes an electronic element base and an electrode including a first electrode having a surface composed of at least Al or an Al alloy and a second electrode composed of a metal nanoparticle sintered body and bonded to the first electrode, the method comprises: a first step of forming the first electrode on the electronic element base; a second step of applying a metal nanoparticle paste including metal nanoparticles having an average particle diameter of 1 to 100 nm, a dispersing agent, and an organic solvent onto the first electrode; and a third step of sintering the metal nanoparticles so that the second electrode is bonded onto the first electrode to form the electrode by performing heating at a temperature equal to or higher than that at which the dispersing agent and the organic solvent included in the metal nanoparticle paste are removed and at a temperature lower than the melting point of the metal nanoparticles in the state in which a predetermined space is ensured around the periphery of the metal nanoparticle paste applied onto the first electrode. Hence, even when an electrode having a surface composed of at least Al or an Al alloy which is liable to generate a bonding problem due to the presence of an oxide film is provided, an electronic element can be obtained which has high bonding reliability and electrical conductivity when being bonded to substrate electrodes.

That is, since an alloy layer which is primarily composed of Al and a constituent element of metal nanoparticles and which has superior bonding properties to both an Al oxide film and a metal nanoparticle sintered body is provided between a layer primarily composed of the Al oxide which is liable to cause a bonding problem and a layer composed of the metal nanoparticle sintered body, the above two layers can be tightly bonded to each other.

In a conventional bonding method, as shown in FIG. 14(c), heating is performed after a substrate and a chip element are overlapped with each other, that is, is it attempted to sinter a metal nanoparticle paste on a substrate electrode while it is covered with the electronic component as if being placed under a lid. In this case, organic components of a binding agent and an organic solvent included in the metal nanoparticle paste are liable to remain, and remaining organic components function to aggregate the metal nanoparticle paste, so that a phenomenon occurs in which an aggregate formed by the above function is first sintered. As a result, high activity of metal fine particles having a size on the order of a nano level is decreased since the size thereof is increased to the order of a micron level, and when Al or an Al alloy is used for an electronic element electrode, the reactivity with an Al oxide film on the electronic element electrode is degraded, so that sufficient bonding properties cannot be obtained.

On the other hand, according to the method for manufacturing an electronic element of the present invention, the metal nanoparticles is sintered by heating at a temperature equal to or higher than that at which the dispersing agent and the organic solvent included in the metal nanoparticle paste can be removed and at a temperature lower than the melting point of the metal nanoparticles in the state in which a predetermined space is ensured around the periphery of the metal nanoparticle paste applied onto the first electrode having a surface composed of at least Al or an Al alloy, so that the second electrode is bonded to the first electrode.

The state in which a predetermined space is ensured around the periphery of the metal nanoparticle paste indicates the state in which the metal nanoparticle paste is not in contact with anything other than the first electrode or in which when the dam portion is provided to prevent the metal nanoparticle paste thus applied from wet-spreading, the metal nanoparticle paste is not in contact with anything other than the first electrode and the dam portion so that the periphery of the metal nanoparticle paste except for the parts thereof in contact with those described above is placed under an open condition.

Under the condition described above, when the heating is performed at a temperature equal to or higher than that at which the dispersing agent and the organic solvent included in the metal nanoparticle paste can be removed and at a temperature lower than the melting point of the metal nanoparticles, the organic components of the binding agent and the organic solvent included in the metal nanoparticle paste can be sufficiently decomposed and removed, and as a result, the metal nanoparticles in the paste can maintain their original size. Even when Al or an Al alloy is used for the electronic element electrode, since the metal nanoparticles has a significantly high activity, they react with an Al oxide film on the electronic element electrode, so that an alloy layer of Al and the constituent element of the metal nanoparticle paste can be easily formed. In the alloy layer described above, Al and the constituent element of the metal nanoparticle paste are mutually diffused to have opposite concentration gradients, and since the alloy layer exhibits superior bonding properties to both the Al oxide and the metal nanoparticle sintered body, the above two can be tightly bonded to each other.

Accordingly, without removing an Al oxide film in advance which is present on the electronic element electrode having a surface composed of at least Al or an Al alloy, the metal nanoparticle sintered body can be bonded thereto with a sufficient bonding strength, and an electronic element having high bonding reliability and electrical conductivity can be obtained when being bonded to substrate electrodes.

In addition, according to the above manufacturing method, the metal nanoparticle paste can be used as an effective bonding material, but it can also be used as a material for forming substrate electrodes and wires. Hence, as a device for supplying the metal paste, an apparatus used in a step of forming electrodes and wires can also be used. Since the apparatus is commonly used as described above, besides the simplification of the process and the reduction in apparatus development cost, a problem in that an electrode pitch design rule differs between in a substrate manufacturing step and in a mounting step can also be solved.

In addition, when the thickness of the metal nanoparticle paste applied onto the first electrode is set to 0.1 μm or more, the thickness of the metal nanoparticle paste sintered body used as the bonding portion can be sufficiently ensured, and when the above thickness is set to 20 μm or less, the dispersing agent and the organic solvent can be sufficiently decomposed and removed even if dispersing agent components of the metal nanoparticle paste are changed, so that it is preferable since the bonding reliability can be stably ensured.

In addition, when the thickness of the metal nanoparticle paste applied onto the first electrode is set to 15 μm or less, the dispersing agent and the organic solvent can be more reliably decomposed and removed even if dispersing agent components of the metal nanoparticle paste are changed, and it is preferable since the bonding reliability can be further improved.

In addition, by performing the heating in an atmosphere containing oxygen at a concentration higher than that in the air, the organic components of the dispersing agent and the organic solvent included in the metal nanoparticle paste can be sufficiently decomposed and removed, and hence it is preferable.

In addition, in a method for manufacturing an electronic element device in which after a bonding material in the form of a paste is applied between an electrode of a first electronic element and an electrode of a second electronic element, the bonding material in the form of a paste is cured so that a bonding portion between the electrode of the first electronic element and the electrode of the second electronic element is formed, when the electrode of said electronic element bonded by the bonding portion is formed by the first to the third steps described above, even if at least one of the first electronic element and the second electronic element has an electrode having a surface composed of at least Al or an Al alloy which is liable to cause a bonding problem due to the presence of an oxide film, an electronic element device having high bonding reliability and electrical conductivity between the electrode of the first electronic element and the electrode of the second electronic element can be obtained.

In addition, in the method for manufacturing an electronic element device, when the bonding portion between the electrode of the first electronic element and the electrode of the second electronic element is formed in the state in which the electrode of the first electronic element and the electrode of the second electronic element face each other, and even when a fine connection portion must be formed in order to realize high density mounting and to reduce a mounting area by increasing the number of electrodes of the electronic element per unit area, sufficient bonding reliability can be ensured.

BRIEF DESCRIPTION OF DRAWINGS

FIGS. 2(a) to 2(e) are schematic views showing one example of a process for manufacturing the electronic element device according to the present invention.

REFERENCE NUMERALS 1 electronic element device (flip chip mounting structure)
2, 14, 20, 205 electronic element
3, 15, 21, 206 electronic element electrode (Al or Al alloy)
4, 16, 207 passivation film
4', 16', 207' dam portion
5, 10, 204 applied metal nanoparticle paste
6, 11, 17, 22, 30, 208 metal nanoparticle sintered body
7, 18, 23, 201 substrate
8, 19, 202 substrate electrode
9, 203 resist film
9', 203' dam portion
12, 209 Al oxide film
13 alloy layer of Al and constituent element of metal nanoparticles
24 substrate electrode (Al or Al alloy)
25 first layer substrate
26 second layer substrate
27 third layer substrate
28, 29 internal electrode (Al or Al alloy)
31, 32 electronic element
33 connection portion
100 electronic element device (face-up bare chip mounting structure)
110 electronic element device (chip element mounting structure)
120 electronic element device (multilayer substrate structure)
300 metal nanoparticle paste
301 metal nanoparticle 302 dispersing agent
303 dispersion medium (organic solvent)

DETAILED DESCRIPTION OF THE INVENTION

Hereinafter, an embodiment of an electronic element and an electronic element device, and a manufacturing method thereof, according to the present invention, will be described in detail with reference to FIGS. 1 to 6.

Figure 1:
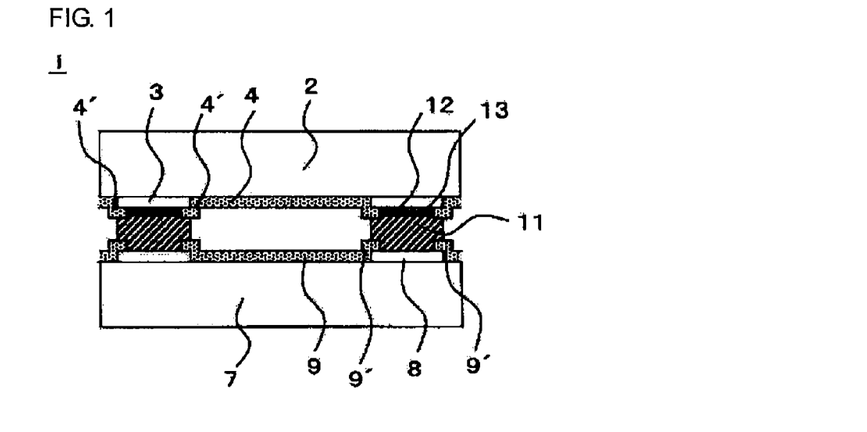
FIG. 1 is a cross-sectional view showing one example of an electronic element device according to the present invention.

As a schematic view of the electronic element and the electronic element device according to the present invention, a cross-sectional view is shown in FIG. 1.

This electronic element device 1 is formed of a substrate 7 and an electronic element 2 so-called flip-chip mounted thereon. The structure of the electronic element device 1 which will be described, that is, electronic element electrodes 3 composed of Al or an Al alloy, a passivation film 4, and dam portions 4' which are formed by extending parts of the passivation film 4 on the electronic electrodes 3 are disposed on the electronic element 2. In addition, on the substrate 7, substrate electrodes 8 provided to obtain electrical conduction to the electronic element 2, a resist film 9, and dam portions 9' which are formed by extending parts of the resist film 9 on the substrate electrodes 8 are disposed. The dam portions 4' and 9' are provided so as to prevent a metal nanoparticle paste from wet-spreading in a step of manufacturing an electronic element, which will be described later, and are not always necessary. In addition, in this embodiment, the part of the passivation film 4 and the part of the resist film 9 are extended on the electronic element electrode 3 and the substrate electrode 8, respectively, to form the dam portions; however, by using different constituent members, the dam portions may be additionally formed.

Figure 4:
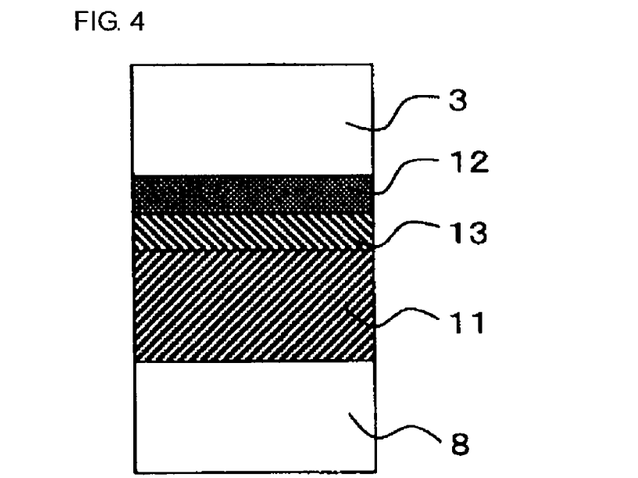
FIG. 4 is a cross-sectional view showing a detailed area structure between the electronic element electrode and a substrate electrode at the stage shown in FIG. 2(e).

The electronic element electrode 3 and the substrate electrode 8 described above are bonded to each other by a sintered body 11 of metal nanoparticles having an average particle diameter of 1 to 100 nm. A detailed area structure at a bonding interface between the electronic element electrode 3 and the metal nanoparticle sintered body 11 is shown in FIG. 4. That is, the above bonding interface has a multilayer structure including, from the side of the electronic element electrode 3 to the side of the metal nanoparticle sintered body 11, (a) a first layer 3 primarily composed of Al, (b) a second layer 12 primarily composed of an Al oxide film, (c) a third layer 13 primarily composed of an alloy of Al and a constituent element of metal nanoparticles, and (d) a fourth layer 11 primarily composed of the constituent element of the metal nanoparticles.

Figure 5:
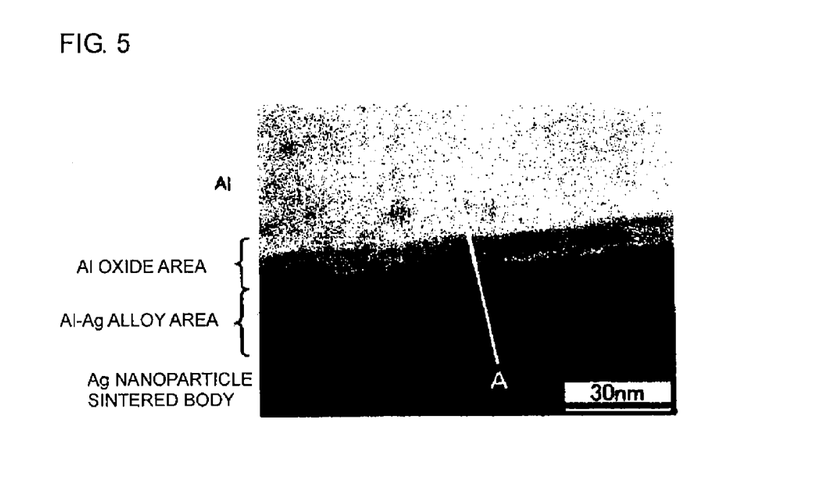
FIG. 5 is a photograph showing a TEM observation result of a bonding interface between the electronic element electrode and the metal nanoparticle sintered body.
Figure 6:
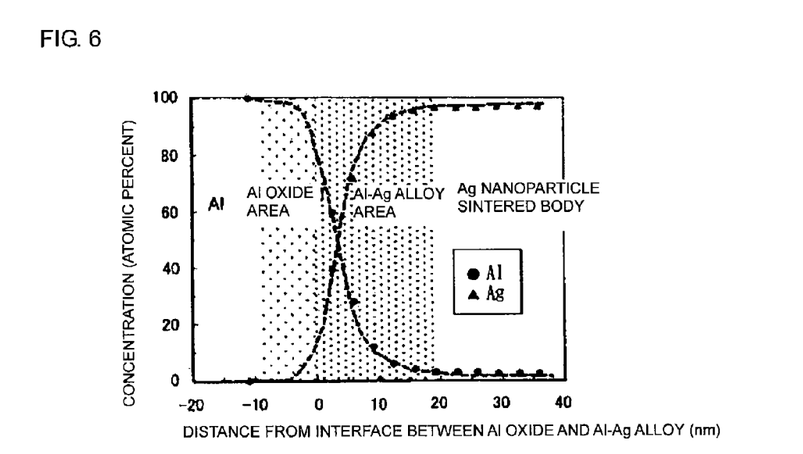
FIG. 6 is a graph showing the result of EDX composition analysis performed in the vicinity of the bonding interface shown in FIG. 5.

The results obtained by composition analysis of the above multilayer structure are shown in FIGS. 5 and 6 by way of example. FIG. 5 shows the result obtained when the bonding interface between the electronic element electrode 3 and the metal nanoparticle sintered body 11 was observed using a TEM (transmission type electron microscope), and FIG. 6 shows the result obtained when composition analysis was performed along the line A-A in FIG. 5 using an EDX (energy dispersion type x-ray microanalyzer). In this example, as a material for the electronic element electrode 3, Al was used, and as the metal nanoparticles, Ag nanoparticles were used.

As shown in FIG. 5, the first layer which is the electronic element electrode and which is composed of Al, the second layer composed of the Al oxide film 12, and the fourth layer composed of a Ag nanoparticle sintered body can be recognized; however, the third layer composed of an alloy of Al and Ag cannot be recognized. On the other hand, according to the composition analysis shown in FIG. 6, the third layer composed of an alloy of Al and Ag can be clearly recognized between the second layer composed of an Al oxide film and the fourth layer composed of a Ag nanoparticle sintered body.

According to this measurement, the third layer composed of an alloy of Al and Ag has a concentration gradient in which the Al concentration decreases from the Al oxide film side to the nanoparticle sintered body side and the Ag concentration increases concomitant with this decrease. That is, since the third layer composed of an alloy of Al and Ag has superior bonding properties to both the second layer composed of an Al oxide layer and the fourth layer composed of a Ag nanoparticle sintered body, the above two layers can be tightly bonded to each other.

Figure 2A:
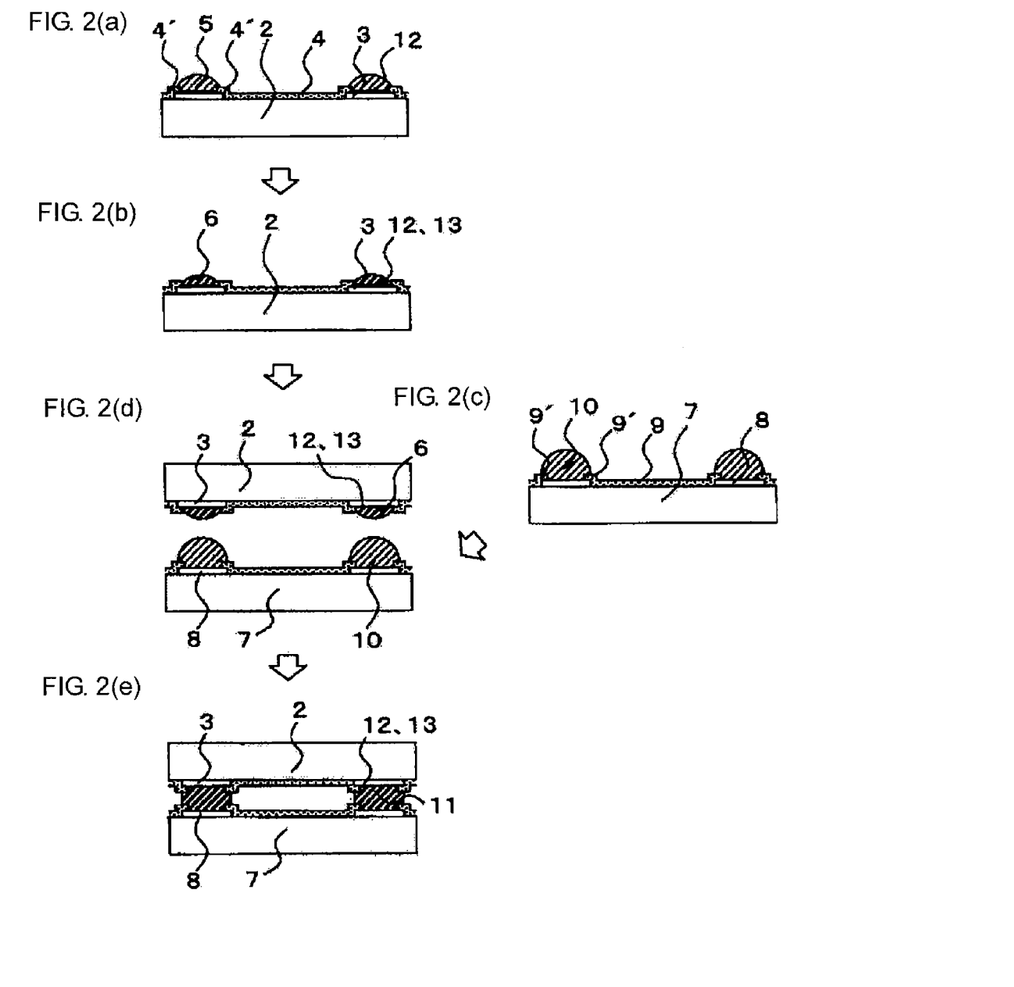

Next, as one example of the method for manufacturing an electronic element and an electronic element device, according to the present invention, a schematic manufacturing process of the electronic element device by flip chip mounting shown in FIG. 1 is shown in FIGS. 2(*a*) to 2(*e*).

First, as shown in FIG. 2(*a*), a metal nanoparticle paste 5 is applied by using a dispenser or the like onto the electronic element electrodes 3, which are composed of Al or an Al alloy, on the electronic element 2. In this process, the passivation film 4 and dam portions 4' may also be provided on the electronic element 2. As described above, since the surface of the electronic element electrode 3 is covered with the Al oxide film 12, the metal nanoparticle paste 5 is practically applied onto the electronic element electrode 3 with the Al oxide film 12 interposed therebetween.

Next, as shown in FIG. 2(*a*), in the state in which a predetermined space is ensured around the periphery of the metal nanoparticle paste, that is, in the state in which the metal nanoparticle paste 5 is not in contact with anything other than the electronic element electrode 3 and the dam portion 4' or in which the periphery of the metal nanoparticle paste except for the parts thereof in contact with those described above is placed under an open condition, heating is performed at a temperature equal to or higher than that at which a dispersing agent and an organic solvent included in the metal nanoparticle paste 5 can be removed and at a temperature lower than the melting point of the metal nanoparticles, so that a metal nanoparticle sintered body 6 is bonded onto the electronic element electrode 3 as shown in FIG. 2(*b*).

Since heating is performed in the state in which a predetermined space is ensured around the periphery of the metal nanoparticle paste 5, organic components in the metal nanoparticle paste 5 are sufficiently decomposed and removed, and the metal nanoparticles can maintain their original size; hence, metal nanoparticles having significantly high activity are allowed to react with the Al oxide film 12 on the electronic element electrode 3, so that the alloy layer 13 composed of the constituent element of the metal nanoparticles and Al can be easily formed.

Figure 3:
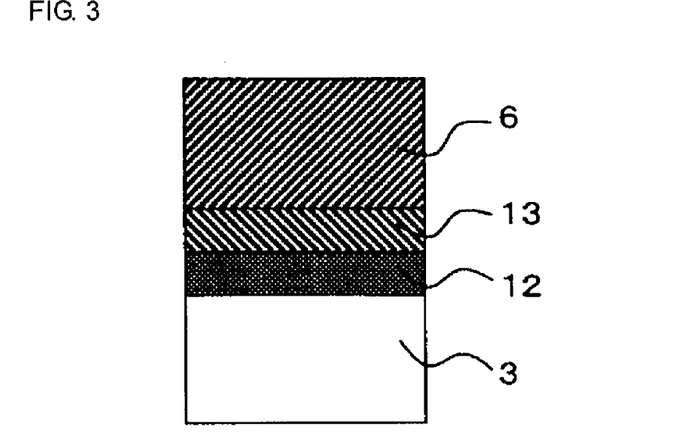
FIG. 3 is a cross-sectional view showing a detailed area structure of a bonding portion between an electronic element electrode and a metal nanoparticle sintered body at the stage shown in FIG. 2(b).

That is, at this stage, although the Al oxide film 12 is provided between the electronic element electrode 3 and the metal nanoparticle sintered body 6 as shown in FIG. 3, they are tightly bonded to each other with the alloy layer 13 of the constituent element of the metal nanoparticles and Al interposed therebetween, and when bonding is subsequently performed to the substrate electrode, an electronic element having high bonding reliability and electrical conductivity can be obtained.

Next, as shown in FIG. 2(*c*), a metal nanoparticle paste 10 is applied onto the substrate electrodes 8 on the substrate 7 by using a dispenser or the like. In this process, the resist film 9 and the dam portions 9' may also be provided on the substrate 7. In addition, in this embodiment, the metal nanoparticle paste 10 is also applied onto the substrate electrode 8 side as the bonding material; however, when Al or an Al alloy is not used as a material for the substrate electrode 8, since an oxide film is not formed on the surface thereof, or since a bonding material is not required to have a high activity, a generally used bonding material, such as a solder paste or a conductive adhesive, may be used instead of the metal nanoparticle paste.

Next, as shown in FIG. 2(d), the electronic element 2 prepared in the step shown in FIG. 2(b) is placed upside down and is aligned with the substrate 7 prepared in the step shown in FIG. 2(c).

Next, as shown in FIG. 2(e), the electronic element 2 and the substrate 7, which are aligned so that the electronic element electrodes 3 and the substrate electrodes 8 face each other, are overlapped with each other, and by heating in the state described above, the metal nanoparticle paste 10 is sintered, so that bonding portions (metal nanoparticle sintered bodies 11) bonding the electronic element electrodes 3 and the substrate electrodes 8 to each other are formed.

That is, at this stage, although the Al oxide film 12 is provided between the electronic element electrode 3 and the substrate electrode 8 as shown in FIG. 4, they are tightly bonded to each other with the alloy layer 13 composed of the constituent element of the metal nanoparticles and Al interposed therebetween, and hence an electronic element device having high bonding reliability and electrical conductivity can be obtained.

Hereinafter, further particular examples of the present invention will be described.

EXAMPLE 1

This example relates to the electronic element device formed by flip chip mounting shown in FIG. 1, and as the electronic element 2 used for the electronic element device 1, a Si-based small semiconductor element was used. The electronic element electrodes 3 disposed on the bottom surface of the electronic element were composed of Al and were formed so as to have a thickness of approximately 0.5 to 2.0 μm. In addition, on the surface of the electronic element electrode 3, the Al oxide film 12 was naturally generated to have a thickness of approximately 5 to 10 nm. On the electronic element 2, the passivation film 4 composed of SiN was disposed. Openings were formed in the passivation film 4 at positions corresponding to the electronic element electrodes 3, and the dam portions 4' were formed around the openings in order to prevent the spread of a metal nanoparticle paste, which will be described later, by extending parts of the passivation film 4 on the electronic element electrodes 3.

As the substrate 7, a ceramic substrate including a low-temperature firable alumina-based material was used. The substrate electrodes 8 were disposed on the upper surface of the substrate 7 at positions at which the electronic element 2 is to be mounted, and the resist film 9 composed of a polyimide-based resin was provided almost all the upper surface of the substrate 7. Openings were formed in the resist film 9 at positions corresponding to the substrate electrodes 8, and the dam portions 9' were formed around the openings in order to prevent the spread of a metal nanoparticle paste, which will be described later, by extending parts of the resist film 9 on the substrate electrodes 8.

The substrate electrode 8 had a multilayer structure of Cu/Ni/Au. The substrate electrode 8 was formed to have a wire width of approximately 10 to 150 μm and a wire thickness of approximately 5 to 50 μm. Although not shown in the figure, other substrate electrodes for mounting other surface mounting elements were also provided on the substrate.

As the metal nanoparticle paste, a Ag nanoparticle paste manufactured by Harima Chemicals, Inc. was used which contained approximately 75 percent by weight of Ag having an average particle diameter of approximately 5 nm. This Ag nanoparticle paste was applied by a dispenser onto the electronic element electrode 3 to have a thickness of approximately 15 μm.

The electronic element 2 provided with the Ag nanoparticle paste as described above was heated in the air by a hot-wind circulation oven in a heating atmosphere in which the heating temperature was 100 to 300° C. and the heating time was 1 to 60 minutes, so that the Ag nanoparticle paste was sintered.

Figure 7:
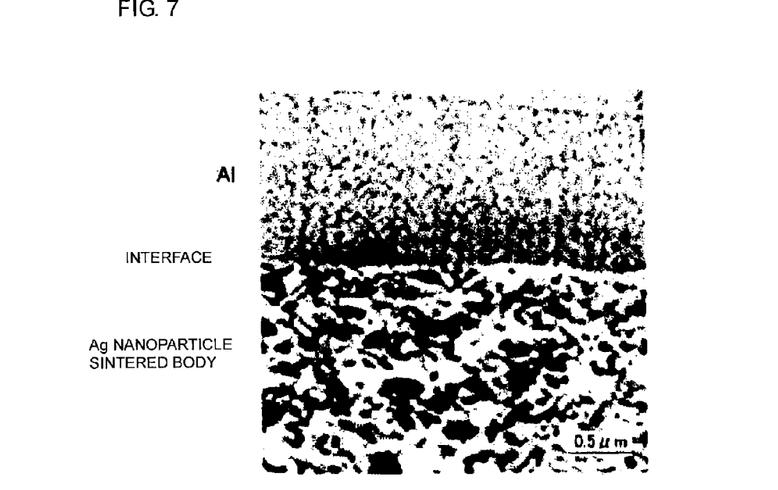
FIG. 7 is a photograph showing the result of SIM observation analysis performed at the bonding interface between the electronic element electrode and the metal nanoparticle sintered body.

A SIM (scanning ion microscope) observation result obtained at the bonding interface between the electronic element electrode 3 and the Ag nanoparticle sintered body 6 at this stage is shown in FIG. 7. As apparent from FIG. 7, the electronic element electrode 3 and the Ag nanoparticle sintered body 6 were tightly bonded to each other.

Figure 8:
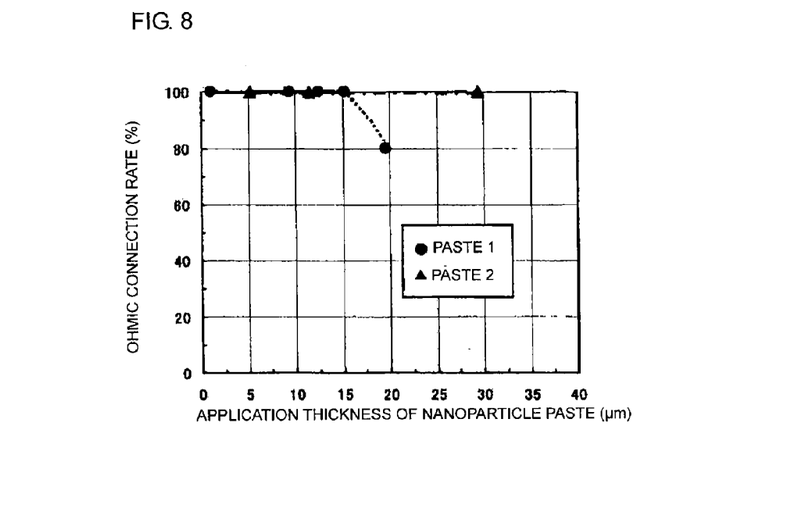
FIG. 8 is a graph showing the influence of an application thickness of a metal nanoparticle paste on an ohmic connection rate.

In addition, the bonding properties were also evaluated from the point of the electrical conduction. FIG. 8 shows the influence of the thickness of the metal nanoparticle paste 5 applied onto the electronic element electrode 3 on an ohmic connection rate. When this evaluation was performed, two types of Ag nanoparticle pastes including different dispersing agents were used. In this example, the ohmic connection rate indicates the probability in which the ohmic connection (in accordance with Ohms' law) is obtained when current-voltage characteristics between the electronic element electrode 3 and the substrate electrode 8 are measured, and when the ohmic connection rate is high, it indicates that the electronic element electrode 3 and the metal nanoparticle sintered body 6 are tightly bonded to each other.

As shown in FIG. 8, it was found that an ohmic connection rate of 80% or more, which hardly causes any practical problems, could be obtained from any of the Ag nanoparticle pastes at an application thickness of 20 μm or less, and that an ohmic connection rate of 100%, which indicates significantly excellent bonding properties, could be obtained at an application thickness of 15 μm or less. From these results, in order to obtain stable bonding reliability by using various metal nanoparticle pastes, the application thickness of the metal nanoparticle paste is preferably set to 20 μm or less and is more preferably set to 15 μm or less.

The reason it is more likely to obtain strong bonding as the application thickness of the metal nanoparticle paste is decreased is believed that when the application thickness is decreased, the exhaust amount of combusted gas of the binding agent and the amount of oxygen supplied to the vicinity of the bonding interface both tend to increase per unit time and per unit volume.

When the exhaust amount of combusted gas and the amount of oxygen supplied to the vicinity of the bonding interface are increased, the decomposition/removal rate of the binding agent per unit time is increased, and hence the metal nanoparticles are brought into contact with the surface of the Al oxide film 12 while maintaining their active surfaces (the surfaces of the metal nanoparticles are essentially very active and are deactivated by the presence of the dispersing agent). As a result, reaction between the constituent element of the metal nanoparticles and Al of the Al oxide film 12 present on the surface of the electronic element electrode 3 advances, so that the alloy layer 13 including the constituent element of the metal nanoparticles and Al is formed.

Next, the Ag nanoparticle paste 10 was applied onto the substrate electrodes 8 on the substrate 7 in an amount which was sufficient or more to bond the electronic element 2 and the substrate 7 by flip chip mounting and which was less than that to bond adjacent electrodes to each other.

Next, the electronic element 2 provided with the Ag nanoparticle sintered bodies 6 bonded onto the electrodes 3 composed of Al was placed upside down and was aligned with the substrate 7 provided with a predetermined amount of the Ag nanoparticle paste 10 applied onto each of the substrate electrodes 8.

Next, the electronic element 2 aligned so that the electronic element electrodes 3 and the substrate electrodes 8 faced each other was overlapped with the substrate 7, and in this state, heating was performed in the air to sinter the Ag nanoparticle paste 10 by using a reflow furnace in a heating atmosphere in which the heating temperature was 100 to 300° C. and the heating time was 1 to 60 minutes, so that the bonding portion (Ag nanoparticle sintered body 11) bonding the electronic element electrode 3 and the substrate electrode 8 to each other was formed.

In addition, the embodiment of the electronic element and the electronic element device, and the manufacturing method in this example are described by way of example, and various changes and modifications may be additionally performed within the spirit and scope of the present invention.

For example, by using a GaAs-based semiconductor, a surface acoustic wave element, or the like as the electronic element 2 as well as a Si-based semiconductor, the electronic element device 1 may also be formed.

In addition, the passivation film 4 disposed on the electronic element 2 and the resist film 9 disposed on the substrate 7 are provided whenever necessary and are not always required. As with the case described above, when an electronic element and a substrate material is used on which the metal nanoparticle paste is not likely to wet-spread, the dam portions 4' and 9' may not be formed in some cases.

In addition, for the electronic element electrode 3, Al-1Cu, Al-1Si, Al-1Si-0.5Cu, or the like containing 90 percent by weight or more of Al may also be used. In addition, to the case in which the surface of the electronic element electrode 3 is composed of at least Al or an Al alloy, that is, also to the case in which Al or the Al alloy as described above is formed into a film on a bump composed of Au or Cu by sputtering, deposition, or the like, the present invention may also be effectively applied since an Al oxide film is present on the surface of the film. The substrate electrode 8 may have a single layer structure of Au, Ag, Cu, or the like or may have a via structure.

In addition, as the metal nanoparticles, for example, besides Ag nanoparticles, Ag alloy nanoparticles, such as Ag—Pd nanoparticles, Au nanoparticles, or Cu nanoparticles may also be used. For example, when Ag—Pd alloy nanoparticles in which approximately 15 percent by weight of Pd is added to Ag are used, Ag migration which may occur depending on use environment of the electronic element device can be effectively suppressed.

In addition, in accordance with the electrode area, application of the metal nanoparticle paste may be performed, for example, by an inkjet apparatus, screen printing, or transfer. In particular, when a very small amount of the metal nanoparticle paste is applied, a microdispenser or an inkjet apparatus which can control the ejection amount with high accuracy is preferably used.

In addition, when the metal nanoparticle paste is sintered, heating is preferably performed in the state in which a sufficient amount of oxygen is supplied so as to sufficiently decompose and remove organic components of the dispersing agent, the organic solvent, and the like included in the metal nanoparticle paste, that is, in an atmosphere in which oxygen in an amount larger than that in the air is contained. As a heating device, in consideration of the shape of the electronic element and the number thereof, for example, an infrared heating oven or a hot plate may be used, and a solder reflow furnace may also be used in some cases.

In addition, in this example, the Ag nanoparticle paste 10 was applied at the substrate electrode 8 side of the substrate 7 in an amount which was sufficient or more to bond the electronic element 2 and the substrate 7 by flip chip mounting and which was less than that to bond adjacent electrodes to each other; however, the Ag nanoparticle paste 10 may be applied to the electronic element electrode 3 side or to both the substrate electrode 8 and the electronic element electrode 3 sides.

In addition, instead of bonding one electronic element 2 to corresponding one substrate 7, after bonding is performed in the wafer state and the assembled substrate state before being divided, the electronic element devices 1 may be separately obtained by performing division. By the method described above, the productivity can be improved.

In addition, a step of filling an underfill resin between the electronic element 2 and the substrate 7 of the manufactured electronic element device, followed by curing, may be further performed. By this additional step, the electronic element device 1 of the present invention can reduce the strain (strain caused by the difference in coefficient of linear thermal expansion between the electronic element 2 and the substrate 7) generated in the connection portion when it is actually used, and hence environmental resistance can be further enhanced. When a wafer before being divided is used for the electronic elements 2 and an assembled substrate is used for the substrates 7, after the bonding and resin filing are performed, a step of separating the electronic element devices 1 from each other may also be provided.

EXAMPLE 2

Figure 9:
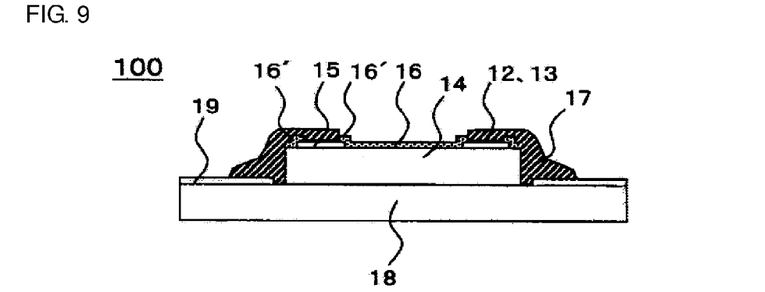
FIG. 9 is a cross-sectional view showing another example of the electronic element device according to the present invention.

FIG. 9 shows another example of the present invention. This example relates to an electronic element device having the structure in which a bare chip was mounted on a substrate in a face-up manner, and as an electronic element 14 used for an electronic element device 100, a Si-based semiconductor element was used. Electronic element electrodes 15 and a passivation film 16 were formed on the upper surface of the electronic element 14, and parts of the passivation film 16 were extended on the electronic element electrodes 15 so as to form dam portions 16'.

In addition, as a substrate 18, a ceramic substrate including a low-temperature firable alumina-based material was used. Substrate electrodes 19 each having a multilayer structure of Cu/Ni/Au were disposed on the upper surface of the substrate 18 and were electrically connected to the electronic element electrodes 15 through Ag nanoparticle sintered bodies 17.

In this example, the electronic element electrode 15 was composed of Al, and although the surface thereof was covered with the Al oxide film 12, the alloy layer 13 of Ag and Al was formed at a bonding interface with the Ag nanoparticle sintered body 17, so that a multilayer structure as shown in FIG. 6 was formed from the electronic element electrode 15 side to the Ag nanoparticle sintered body 17 side.

This electronic element device 100 may be formed such that after the electronic element 14 bonded in advance with the Ag nanoparticle sintered bodies is placed on the substrate 18 in a face-up manner instead of the flip-chip manner of Example 1, heating is performed under conditions similar to those in Example 1.

EXAMPLE 3

Figure 10:
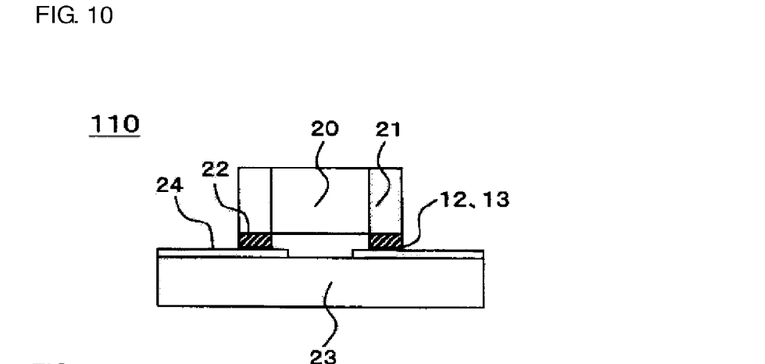
FIG. 10 is a cross-sectional view showing another example of the electronic element device according to the present invention.

FIG. 10 shows still another example of the present invention. This example relates to an electronic element device having the structure in which a passive element was mounted on a substrate, and as an electronic element 20 used for an electronic element device 110, a multilayer ceramic capacitor including a $BaTiO_3$-based dielectric material was used. At two ends of the electronic element 20, electrodes 21 each formed by plating Ni/Sn on an underlayer electrode composed of a Cu sintered body were disposed.

In addition, as a substrate 23, a composite material substrate including a glass epoxy was used. Substrate electrodes 24 each having a single layer structure of Al were disposed on the upper surface of the substrate 23 and were electrically connected to the electronic element electrodes 21 through Ag nanoparticle sintered bodies 22.

In the case of this example, since the surface of the substrate electrode 24 was covered with the Al oxide film 12, a Ag nanoparticle paste was applied onto the substrate electrode 24, so that the alloy layer 13 of Ag and Al and the Ag nanoparticle sintered body were formed at the substrate electrode 24 side. Accordingly, a multilayer structure as shown in FIG. 6 was formed from the substrate electrode 24 side to the Ag nanoparticle sintered body 22 side.

This electronic element device 110 may be formed such that after the electronic element 20 is placed by a chip mounter or the like on the substrate 23 bonded in advance with the Ag nanoparticle sintered bodies, heating is performed under conditions similar to those in Example 1.

EXAMPLE 4

Figure 11:
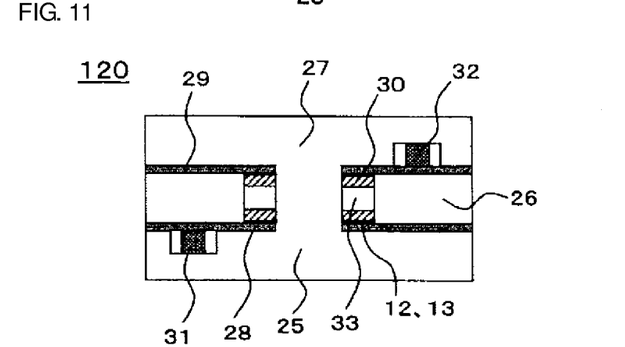
FIG. 11 is a cross-sectional view showing another example of the electronic element device according to the present invention.

FIG. 11 shows still another example of the present invention. This example relates to an electronic element device having a multilayer substrate structure, and in an electronic element device 120, a first layer substrate 25, a second layer substrate 26, and a third layer substrate 27 were included. In the first layer substrate 25, internal electrodes 28 composed of Al and an electronic element 31, such as a multilayer ceramic capacitor, were included, and in the third layer substrate 27, internal electrodes 29 composed of Al and an electronic element 31, such as a multilayer ceramic capacitor, were included as in the first layer. The internal electrodes 28 and 29 were connected to each other with a connection portion 33 formed by curing a conductive paste in a via hole formed in the second layer. As a material for the multilayer substrate, for example, a composite material formed by mixing inorganic filler, such as alumina, with an epoxy resin may be used.

In this example, since the surfaces of the internal electrodes 28 and 29 were each covered with the Al oxide film 12, a Ag nanoparticle paste was applied onto the internal electrodes 28 and 29, so that the alloy layers 13 of Ag and Al and Ag nanoparticle sintered bodies 30 were formed. Hence, from each side of the internal electrodes 28 and 29 to the Ag nanoparticle sintered body 30 side, a multilayer structure as shown in FIG. 6 was formed.

As a method for manufacturing the multilayer substrate, after the internal electrodes 28 and 29 were patterned in advance, and the electronic elements 31 and 32 were mounted thereon, multilayer substrate materials each including prepregs were pressed thereon, so that the internal electrodes 28 and 29 and the electronic elements 31 and 32 were enclosed in the respective prepregs.

Subsequently, after the prepregs were cured under predetermined conditions, the Ag nanoparticle paste was applied to the internal electrodes at the exposed surface sides thereof and was then sintered under conditions similar to that in Example 1, so that the first substrate 25 and the third layer substrate 27 each provided with the Ag nanoparticle sintered bodies were formed.

Next, after a via hole was formed in prepregs for the second layer, and a thermosetting conductive paste was filled in the via hole, the prepregs for the second layer substrate 26 were provided between the first layer substrate 25 and the third layer substrate 27 and were aligned and overlapped therewith, followed by heating for bonding between the substrates.

The invention claimed is:

1. An electronic element comprising:
   an electronic element base;
   a first electrode having a surface composed of at least Al or an Al alloy;
   a second electrode composed of a metal nanoparticle sintered body; and
   a bonding interface between the first electrode and the second electrode, the bonding interface having a multilayer structure including, from the side of the first electrode to the side of the second electrode:
   (a) a first layer primarily composed of Al;
   (b) a second layer primarily composed of an Al oxide;
   (c) a third layer primarily composed of an alloy of Al and a constituent element of metal nanoparticles; and
   (d) a fourth layer primarily composed of the constituent element of the metal nanoparticles.

2. The electronic element according to claim 1, wherein the metal nanoparticles include Ag or an Ag alloy.

3. An electronic element device in which an electrode of a first electronic element and an electrode of a second electronic element are electrically connected to each other with a bonding portion interposed therebetween,
   wherein at least one of the first electronic element and the second electronic element is the electronic element according to claim 1, the electrode of the at least one of the first electronic element and the second electronic element electrically connected through the bonding portion includes the first electrode and the second electrode, and a bonding interface therebetween has the multilayer structure.

4. The electronic element device according to claim 3, wherein the electrode of the first electronic element and the electrode of the second electronic element are connected so as to face each other.

* * * * *